United States Patent [19]
Carmody et al.

[11] Patent Number: 5,549,784
[45] Date of Patent: Aug. 27, 1996

[54] METHOD FOR ETCHING SILICON OXIDE FILMS IN A REACTIVE ION ETCH SYSTEM TO PREVENT GATE OXIDE DAMAGE

[75] Inventors: Kevin F. Carmody, Hillsboro; Peter K. Charvat, Portland; Gilroy J. Vandentop, Aloha, all of Oreg.

[73] Assignee: Intel Corporation, Santa Clara, Calif.

[21] Appl. No.: 306,251

[22] Filed: Sep. 14, 1994

Related U.S. Application Data

[63] Continuation of Ser. No. 940,680, Sep. 4, 1992, abandoned.

[51] Int. Cl.$^6$ .................................................... H01L 21/00
[52] U.S. Cl. ........................... 156/643.1; 156/644.1; 156/646.1; 156/657.1
[58] Field of Search ......................... 156/643.1, 646.1, 156/657.1, 644.1; 437/228, 235, 238

[56] References Cited

U.S. PATENT DOCUMENTS

| | | | |
|---|---|---|---|
| 4,028,155 | 6/1977 | Jacob | 156/643 |
| 4,325,778 | 4/1982 | Lepselter | 156/646 X |
| 4,376,672 | 3/1983 | Wang et al. | 156/345 X |
| 4,522,681 | 6/1985 | Gorowitz et al. | 156/643 |
| 4,561,172 | 12/1985 | Slawinski et al. | 156/643 X |
| 4,814,041 | 3/1989 | Auda | 156/657 X |
| 5,173,151 | 12/1992 | Namose | 156/657 X |
| 5,254,213 | 10/1993 | Tamaki | 156/657 X |
| 5,296,094 | 3/1994 | Shan et al. | 156/651 |

OTHER PUBLICATIONS

Takuo Sugano, *Applications of Plasma Processes to VLSI Technology*, 1980, A Wiley–Interscience Publication–John Wiley & Sons, pp. 220–222.

K. J. McLaughlin, S. W. Butler, T. F. Edgar, and I. Trachtenberg, "Development of Techniques for Real–Time Monitoring and Control in Plasma Etching" *Journal of the Electrochemical Society*, vol. 138, No. 3, Mar. 1991.

*Primary Examiner*—Thi Dang
*Attorney, Agent, or Firm*—Blakely, Sokoloff, Taylor & Zafman

[57] ABSTRACT

The present invention discloses a method for the etching of insulating films, specifically silicon oxide films, using a fluorine-helium-oxygen gas mixture in the fabrication of semiconductor devices. The method utilizes a prior art reactive ion etch system and adds a quantity of helium to a pre-established fluorine-oxygen chemistry to reactively etch the silicon oxide film while minimizing the occurrence of gate charging resulting from damage to the gate oxide. The addition of helium gas into the etch chemistry must be such that the flow of helium is at least 20% of the sum of the total fluorine, helium, and oxygen flows. The resulting etch chemistry, which can be used in any commercially available reactive ion etch system, produces a more uniform etch while reducing gate oxide damage so as to minimize charging of the semiconductor gate.

13 Claims, 2 Drawing Sheets

METHOD FOR ETCHING SILICON OXIDE FILMS IN A REACTIVE ION ETCH SYSTEM TO PREVENT GATE OXIDE DAMAGE

This is a continuation of application Ser. No. 07/940,680, filed Sep. 4, 1992, now abandoned.

BACKGROUND OF THE INVENTION

(1) Field of the Invention

The present invention relates to the field of fabricating integrated circuits, and particularly the field of via or contact etching of insulating films formed in semiconductor devices.

(2) Prior Art

In the fabrication of integrated circuits, it is often desired to etch certain areas of a film formed in a semiconductor substrate used as an insulating layer between the gate regions of semiconductor devices and the interconnects formed above these regions. Via or contact etching of the film is performed to create contact openings in the insulating layer between the interconnects and the source and drain regions in the substrate. In the prior art, this has been most readily accomplished by reactive ion etching of a silicon oxide film used as the insulating film.

In the formation of contacts in a semiconductor substrate, a silicon oxide film is deposited over the gate, source and drain regions of the device. The film is then coated with a layer of an organic photoresist, with openings formed in the photoresist to expose selected areas of the underlying silicon oxide film. The device is next placed in an etch chamber of a reactive ion etch system to etch the exposed areas of the silicon oxide film.

The chamber, which is a controlled environment, includes means for introducing gas to the chamber and electrodes for producing plasma from the gas. Typically, a fluorine-oxygen gas mixture or chemistry is used for the etching of silicon oxide films. The gas is introduced to the chamber and RF energy is applied to produce the plasma. Etching takes place until the RF energy is removed, with the timing of the process, pressure, RF energy and flow rate controlling the depth of etching.

A significant drawback in the conventional methods for contact etching of the insulating film is the damage caused to the gate oxide and the resulting accumulation of charge at the interface between the gate and the silicon oxide film. A substantial amount of gate charging results during the etch process by the accumulation of charge in "traps" associated with defects in the silicon oxide film, such as impurities and broken bonds. When a considerable amount of gate charging occurs in a particular etch, the threshold voltage of the gate shifts, thereby changing the minimum bias of the gate, and in some cases, leading to complete breakdown of the gate oxide.

The problem of gate charging is further worsened by the fact that the accumulation of charge is cumulative throughout the entire manufacturing process of semiconductor devices. Since gate charging increases as the sequential steps of the manufacturing process are performed, additional steps have been implemented throughout the process to prevent or cure the damage. Clearly, the occurrence of gate charging results in a significant increase in cost and a reduced yield in the over-all manufacture of semiconductor devices.

In response to this problem, several prior art methods have been devised in an attempt to prevent or cure the resulting gate oxide damage. A first prior art method employs the use of high temperature annealing steps in the manufacturing process to cure the damage after it has occurred by tying up any existing broken bonds. A second prior art method comprises the addition of various insulating films on the backside of the substrate through well-known deposition techniques to prevent the accumulation of charge through contact with potential sources of charge. A third prior art method consists of re-engineering the entire contact etch by varying the variables and chemistry of the particular etch. This re-engineering may require new process gasses and/or new equipment to obtain the proper etch in which gate charging is minimized.

There are several disadvantages in the prevention and/or cure of the gate oxide damage by the prior art methods. In the first method, the addition of extra annealing steps increases both the manufacturing cost and the cycle time for completing a batch. There are also process integration issues with this cure due to the fact that the high temperature requirements cause greater diffusion of the implanted source and drain regions, thereby limiting the high temperature steps that may be used later in the process. In addition, the gate oxide may be completely destroyed, in which case it is not possible to use this approach. With respect to the second method, the growth or deposition of a backside insulator requires an extra step in the manufacturing process, which therefore increases the cost and reduces the batch yield. There are also similar integration issues as with the first method due to the fact that the addition of a back-side insulator will alter several of the steps in the manufacturing process, especially those which require the wafer to be thermally treated. In the third method, the complete re-engineering of the etched gate is a very time consuming process which similarly increases cost and significantly affects the time it takes to qualify the batch before it can reach the market. In addition, the gate oxide damage is usually not identified until late in the manufacturing development cycle, thereby preventing adjustment of the etch process at such a late time.

Therefore, it is an object of the present invention to provide a method for the contact etching of silicon oxide films formed in semiconductor devices using a reactive ion etch system to prevent damage to the gate oxide, thereby minimizing charging of the semiconductor device.

It is a further object of the present invention to provide a method for the etching of insulating films using an improved fluorine/oxygen gas chemistry in a dry etch system to obtain a more uniform etch and prevent gate oxide damage without significantly affecting the other etch characteristics of the etch process.

Another object of the present invention is to avoid the costly and time consuming prior art methods for preventing and curing gate oxide damage.

SUMMARY OF THE INVENTION

The present invention discloses a method for the contact etching of an insulating film formed in a semiconductor substrate using a dry etch system. The preferred method includes forming a silicon oxide film over the gate regions of a semiconductor substrate and forming a photoresist thereon to pattern the underlying film. In etching the exposed areas of the silicon oxide film, a reactive ion etch system is utilized wherein a quantity of helium gas is introduced into a fluorine-oxygen gas chemistry.

The existing process parameters of a prior art reactive ion etch system need not be significantly altered except for the addition of helium to the fluorine-oxygen gas chemistry such that the helium flow is at least 20% of the total fluorine-helium-oxygen flow. The addition of helium to the process may be easily and safely achieved by simply connecting a bottle of inert helium gas to the gas intake system of a reactive ion etch system. In addition, since the improved method of the present invention minimizes gate oxide damage occurring throughout the manufacture of integrated circuits, other equipment and techniques may now be added to the manufacturing process in order to decrease the cost and increase the batch yield.

BRIEF DESCRIPTION OF THE DRAWINGS

The objects, features and advantages of the present invention will become apparent from the following detailed description of the preferred embodiment in which.

DETAILED DESCRIPTION OF THE INVENTION

A method for the etching of an insulating film 2 formed in a semiconductor device utilizing a novel etch chemistry in a dry etch system is described. In the following description, numerous details such as specific materials, chemicals, process parameters and techniques are set forth in order to provide a more thorough understanding of the present invention. It will be obvious, however, to those skilled in the art, that the present invention can be practiced without these specific details. In other instances, well-known processes, etch equipment and the like are not described in detail in order not to unnecessarily obscure the present invention.

The preferred method of the present invention is designed to be used for contact etching of silicon oxide films 2 using a fluorine-oxygen-helium gas chemistry in a hexode reactive ion etch system. However, it will be obvious to those skilled in the art that substantially the same method may be employed in etching a variety of insulating films 2 with a variety of dry etch equipment configurations.

In a reactive ion etch system using a hexode reactor, a hexagonally shaped inner electrode having an elongated, tubular form is coaxially disposed within a cylindrical electrode tube. The inner hexagonal electrode, on which the silicon wafers are placed in a hanging position, is the "power" electrode and is coupled to an RF generator. The other electrode is known as the "ground" electrode. When the gases are fed into the chamber, RF energy is applied to the power electrode to create a plasma that performs the etching. The hexagonal configuration of the reactor provides a good directional etching capability while minimizing the ionic bombardment of the grounded electrode.

Figure 1:
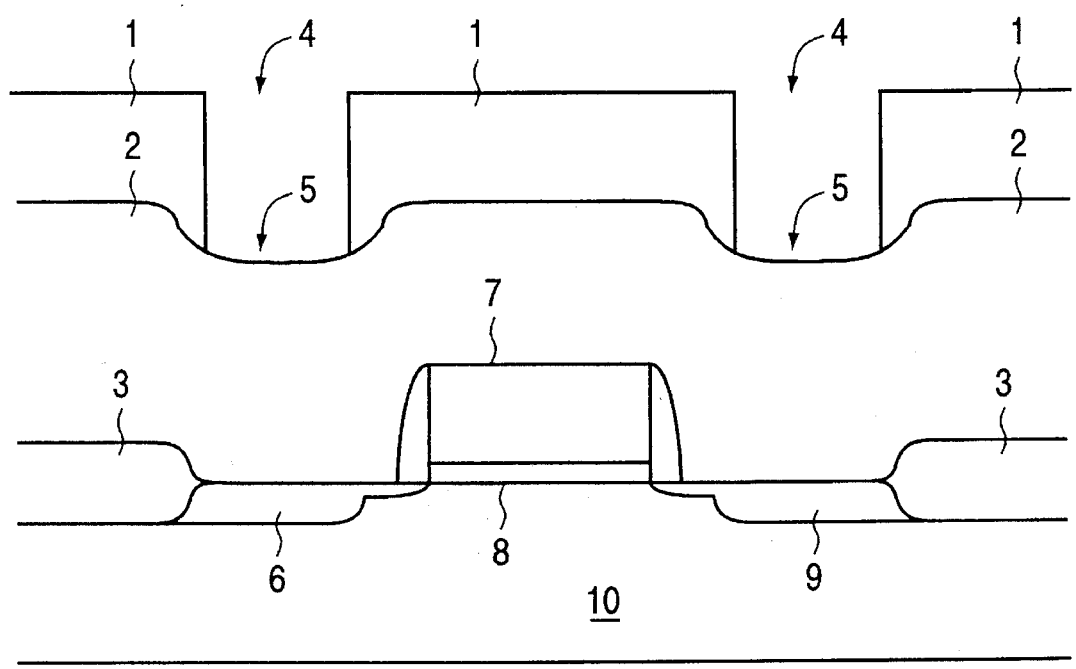
FIG. 1 illustrates a cross-sectional view of a semiconductor device showing the silicon oxide film formed over the gate, source and drain regions of the device and a photoresist layer formed thereon with openings defined in the photoresist layer.
Figure 2:
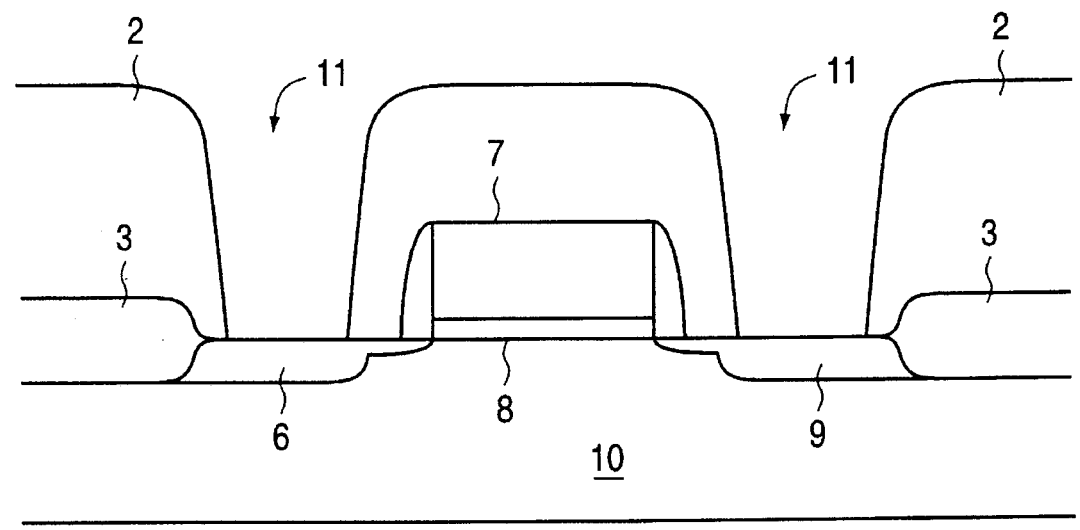
FIG. 2 illustrates the semiconductor device of FIG. 1 after the exposed regions of the silicon oxide film have been etched to expose the source and drain regions of the device.

The method of the present invention is illustrated in FIGS. 1 and 2. In FIG. 1, an insulating film 2 is formed over a semiconductor device having source, gate and drain regions 6, 7, 9 formed in the substrate 10 of a silicon wafer by techniques well-known in the art. An organic photoresist layer 1 is subsequently formed over the film 2 and openings 4 are defined in the photoresist layer 1 using well-known photolithographic methods so as to expose those regions 5 of the film 2 overlying the source and drain regions 6, 9. Next, the fluorine-oxygen-helium chemistry is introduced into the etch chamber and RF power is applied to create a plasma. The pressure of the chamber as well as the flow rate of the gasses is controlled, and the film 2 is etched to the desired depth to form contact openings 11 over the source and drain regions 6, 9 of the semiconductor device as shown in FIG. 2.

In the preferred method of the present invention, the insulating film 2 comprises $SiO_2$, however, the film may also include (but is not limited to) any one or a combination of silicon-based films such as BPSG, PSG, BSG, PTEOS and TTEOS. In addition, the insulating film need not be a silicon-based film, but may also comprise a polyimide film, a parylene film or other insulating film. The gas chemistry used to form the plasma includes fluorine, oxygen, and helium wherein the fluorine gas comprises $CHF_3$. However, the fluorine gas may also comprise any one of $CF_4$, $SF_6$ and $NF_3$. The helium gas is added to a pre-established fluorine-oxygen chemistry such that the helium flow comprises at least 20% of the total fluorine-oxygen-helium flow. That is, once the optimum fluorine-to-oxygen ratio is established for a contact etch utilizing only the fluorine-oxygen gas chemistry, a helium flow corresponding to at least 20% of the current fluorine-oxygen-helium flow is added to the gas intake system.

In the implementation of the preferred method, the flow rates for the fluorine ($CHF_3$), oxygen and helium gases are in the range of approximately 80–200 sccm, 5–20 sccm and 55–600 sccm, respectively, and in one preferred embodiment are approximately 140 sccm, 7 sccm and 200 sccm, respectively. Reactive ion etching takes place at an RF power of approximately 2000 watts and a pressure of approximately 50 milliTorr with an electrode temperature of 50° to 60° C. Although the present invention contemplates using a hexode reactive ion etch system, such as the Applied Materials 8310, the particular chemistry of the present invention can be used in other types of dry etch equipment configurations to obtain a contact etch resulting in minimal gate oxide damage. Although a substantial reduction in gate oxide damage is achieved with a helium flow comprising 20% of the total current flow, it has been observed that a significantly greater benefit is achieved with helium flows of at least 30% and that the benefit increases with higher flows. This relationship has been found to hold true up to the maximum flow rate at which point the pumps can no longer evacuate the increased gas flows into the chamber. In addition, the helium flow should be maintained for the duration of the etch process in order to obtain the best results.

Figure 3:
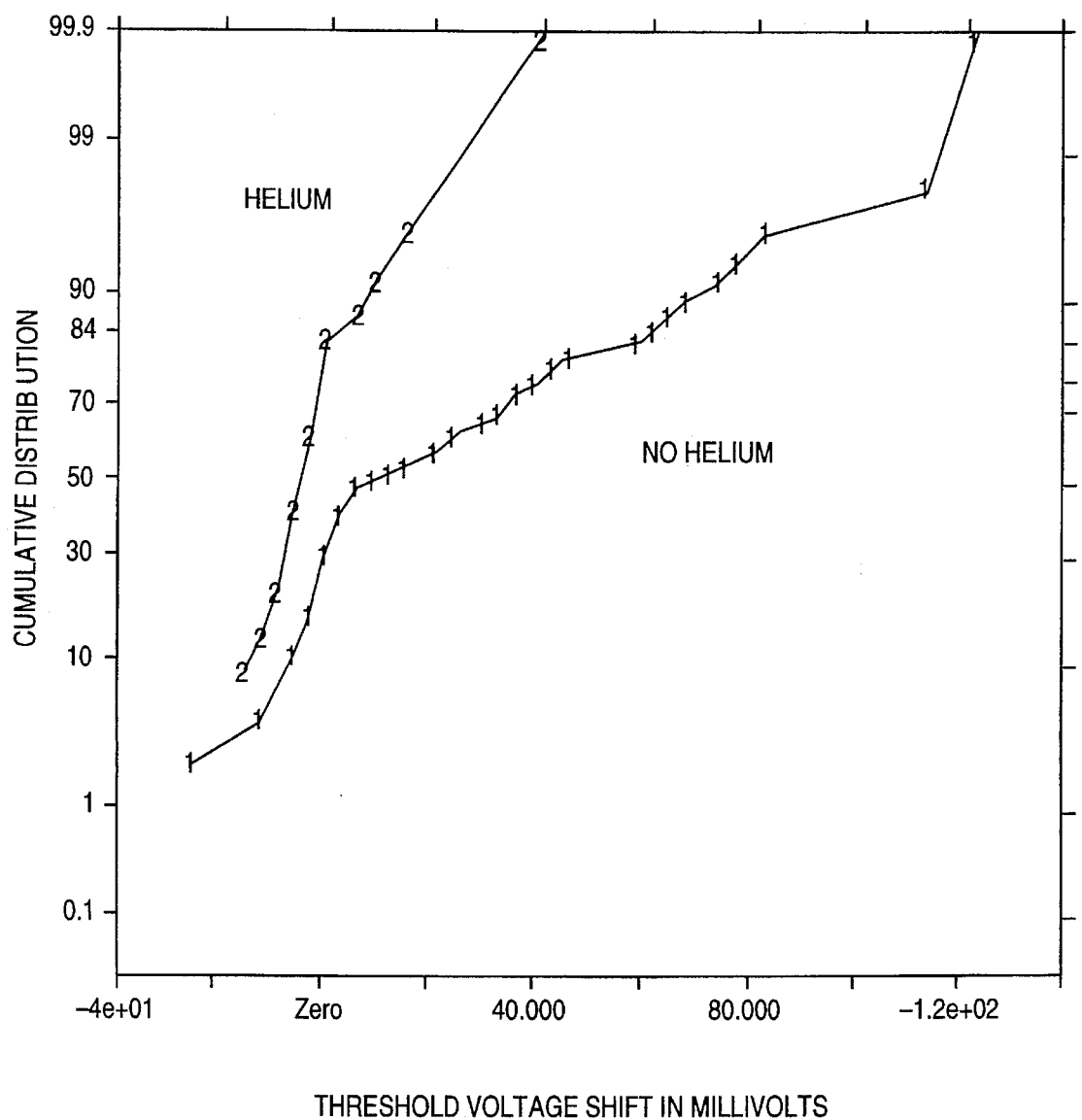
FIG. 3 is a graph illustrating the resulting threshold voltage shifts for a first semiconductor gate wherein the contact holes were etched using a fluorine-oxygen chemistry and a second semiconductor gate in which the contact holes were etched with fluorine-oxygen-helium chemistry.

When the insulating film 2 is exposed to the fluorine-oxygen-helium plasma, the exposed regions 5 of the film 2 are etched due to the disassociation of the $CHF_3$ molecules and the formation of the volatile $SiF_4$ species. The areas underneath the organic mask 1 are not etched since the reactant, fluorine, is blocked from the surface by the photoresist layer 1. The etch proceeds until the implanted regions 6, 9 of the semiconductor device underlying the film 2 are exposed. Typically, the etch continues for a time longer than is necessary to ensure the complete removal of the exposed film 2 despite etch rate variations. As a result of the helium addition to the fluorine-oxygen chemistry, charging of the semiconductor gate is substantially reduced, thereby minimizing the threshold voltage shifts of the gate as can be seen in the graph of FIG. 3. This significant benefit is obtained only at the small cost of reducing the etch rate by approximately 10% which is caused by the low ionization efficiency and chemical inertness of helium.

As a result of the method of the present invention, damage to the gate oxide caused by gate charging can be minimized in the manufacture of semiconductor devices. Therefore, other equipment and etches may now be used during the manufacturing process which would have otherwise caused excessive gate oxide 8 damage if used in conjunction with the prior art methods. With the ability to change the over-all manufacturing process, the cost of the process may be reduced while significantly increasing the yield of high quality semiconductor devices.

While the present invention has been described in conjunction with the preferred embodiment and FIGS. 1–3, it is evident that numerous alternatives, depictions, variations and uses will be apparent to those skilled in the art in light of the foregoing description.

We claim:

1. A method for etching an insulating film in the fabrication of an integrated circuit, said etching performed in a dry etch system using a plasma formed from a gas mixture, said method comprising:

forming said insulating film over a semiconductor device, wherein said semiconductor device comprises a source region, a drain region, and a gate region;

forming said gas mixture from a first flow of a helium gas in combination with a second flow of a fluorine gas and a third flow of an oxygen gas, with said second flow comprising at least 30% of a sum of said first and said third flows, and with said first flow comprising at least 20% of a sum of said first, said second, and said third flows;

applying power to said gas mixture in said system to form said plasma, wherein said step of applying power to said gas mixture to form said plasma is performed with a wattage of approximately 2000 watts while said gas mixture is under a pressure of approximately 50 milliTorr; and exposing said insulating film to said plasma in a hexode reactor to remove selected regions of said insulating film.

2. The method of claim 1, wherein said method further comprises the steps of:

forming a photoresist layer on said insulating film before forming said gas mixture; and defining openings in said photoresist layer to expose said selected regions of said insulating film.

3. The method of claim 1, wherein said first flow of said helium gas comprises a gas flow in the range of 55–600 sccm, said second flow of said fluorine gas comprises a gas flow in the range of 80–200 sccm and said third flow of said oxygen gas comprises a gas flow in the range of 5–20 sccm.

4. The method of claim 1, wherein said first flow of a helium gas and said third flow of an oxygen gas form a binary mixture comprising between 91.7% and 96.8% of said helium gas and between 3.2% and 8.3% of said oxygen gas, with said second flow of a fluorine gas comprising between 32.3% and 133.3% of said binary mixture.

5. The method of claim 1, wherein said first, second and third flows are maintained for the duration of said etching.

6. The method of claim 1, wherein said insulating film comprises a material selected from the group consisting of SiO2, BPSG, PSG, BSG, PTEOS TTEOS, polymide film, and parylene film.

7. The method of claim 1, wherein said fluorine gas comprises a gas selected from the group consisting of CF4, CHF3, SF6 and NF3.

8. A method for contact etching a silicon oxide film in a dry etch system in the fabrication of a semiconductor device having a source region, a drain region, and a gate region formed in a semiconductor substrate, said method comprising:

forming said silicon oxide film over said source region, said drain region, and said gate region;

forming a photoresist layer on said silicon oxide film;

defining openings in said photoresist layer to expose regions of said silicon oxide film overlying said source region and drain region;

introducing a gas mixture of a fluorine gas, an oxygen gas and a helium gas to a hexode reactor of a reactive ion etch system, with said helium gas comprising at least 20% of the sum of said fluorine, said helium, and said oxygen gasses;

applying RF power of approximately 2000 watts to said gas mixture in said hexode reactor while said gas mixture is under a pressure of approximately 50 milliTorr to form a plasma; and exposing said silicon oxide film to said plasma in said hexode reactor to expose said source and drain regions.

9. The method of claim 8, wherein said step of introducing said gas mixture into said hexode reactor is performed by introducing said helium gas with a gas flow in the range of 55–600 sccm, introducing said fluorine gas with a gas flow in the range of 80–200 sccm and introducing said oxygen gas with a gas flow in the range of 5–20 sccm.

10. The method of claim 9, wherein said first, second and third flows are maintained for the duration of said etching.

11. The method of claim 9, wherein said silicon oxide film comprises a material selected from the group comprising SiO2, BPSG, PSG, BSG, PTEOS and TTEOS.

12. The method of claim 9, wherein said fluorine gas comprises a gas selected from the group consisting of CF4, CHF3, SF6 and NF3.

13. A method for the contact etching of a silicon oxide film in the fabrication of a semiconductor device having a source region, a drain region, and a gate region formed in a semiconductor substrate, said etching performed in a hexode reactor of a reactive ion etch system, said method comprising:

forming said silicon oxide film over said semiconductor device, said silicon oxide film comprising a material selected from the group consisting of SiO2, BPSG, PSG, BSG, PTEOS and TTEOS, wherein said silicon oxide film is formed over said source, drain, and gate regions;

forming a photoresist layer on said silicon oxide film;

defining openings in said photoresist layer to expose regions of said silicon oxide film overlying said source and drain regions;

introducing a gas mixture, said gas mixture comprising a fluorine gas with a gas flow in the range of 80–200 sccm, said fluorine gas comprising a gas selected from the group consisting of CF4, CHF3, SF6 and NF3; an oxygen gas with a gas flow in the range of 5–20 seem; and a helium gas with a gas flow in the range of 55–600 sccm;

applying RF power of approximately 2000 watts to said gas mixture to form a plasma, with said gas mixture under a pressure of approximately 50 milliTorr; and etching said silicon oxide film in said hexode reactor with said plasma to expose said source and drain regions.

* * * * *